United States Patent [19]

Ko et al.

[11] Patent Number: 4,616,159

[45] Date of Patent: Oct. 7, 1986

[54] DRIVING CIRCUIT FOR PULSATING RADIATION DETECTOR

[75] Inventors: Wen H. Ko, Cleveland Hts.; Gong-Jong Yeh, Cleveland, both of Ohio

[73] Assignee: The North American Manufacturing Company, Cleveland, Ohio

[21] Appl. No.: 724,955

[22] Filed: Apr. 22, 1985

Related U.S. Application Data

[63] Continuation of Ser. No. 525,274, Aug. 22, 1983, abandoned.

[51] Int. Cl.$^4$ .......................... H05B 37/02; G05F 1/00
[52] U.S. Cl. ...................................... 315/307; 315/194; 315/287
[58] Field of Search ........................... 315/287, 194, 307

[56] References Cited

U.S. PATENT DOCUMENTS

| | | | |
|---|---|---|---|
| 2,482,894 | 9/1949 | Bird | 315/282 |
| 2,802,143 | 8/1957 | Kobayashi | 315/282 |
| 3,611,021 | 10/1971 | Wallace | 315/307 |
| 3,648,106 | 3/1972 | Engel et al. | 315/307 |
| 3,739,177 | 6/1973 | Ko | 250/202 |
| 3,987,339 | 10/1976 | Wroblowski | 315/282 |
| 4,157,477 | 1/1979 | Kall et al. | 250/548 |
| 4,170,747 | 10/1979 | Holmes | 315/287 |
| 4,412,154 | 10/1983 | Klein | 315/307 |
| 4,442,382 | 4/1984 | Fleck | 315/287 |
| 4,453,109 | 6/1984 | Stupp et al. | 315/DIG. 7 |
| 4,464,606 | 8/1984 | Kane | 315/307 |
| 4,471,269 | 9/1984 | Ganser et al. | 315/307 |
| 4,477,748 | 10/1984 | Grubbs | 315/DIG. 2 |

OTHER PUBLICATIONS

"H 3109 Discriminating Detector", North American Mfg. Co., Cleve. Ohio, Bulletin 101.03, Jul. 81 (4 pages).

Primary Examiner—Harold Dixon
Attorney, Agent, or Firm—Body, Vickers & Daniels

[57] ABSTRACT

There is provided an improvement in a pulsating radiation detector system comprising means in a series circuit for emitting radiation in pulses of a selected, adjusted frequency, means responsive to pulses of radiation at the frequency for creating a control signal related to the received radiation and a driving circuit for pulsating the radiation emitting means in the series circuit. The improvement comprises a modification of the driving circuit to produce voltage pulses in the series circuit at a time base width less than the reciprocal of the frequency (in seconds), with means for sensing current flow in the series circuit, means for limiting current flow in the series circuit and means for adjusting the pulse width continuously as an inverse function of the sensed circuit whereby short distinct pulses can be created for better discrimination and accuracy in the detector system.

11 Claims, 19 Drawing Figures

DUTY CYCLE (PULSE WIDTH) ~ I TUBE
(FEEDBACK CURRENT CONTROL)

(DUAL DISCRIMINATION)

TRANSIENTS TO POWER SUPPLY 4,616,159

DRIVING CIRCUIT FOR PULSATING RADIATION DETECTOR

This is a continuation, of Ser. No. 525,274 filed Aug. 22, 1983 now abandoned.

The present invention relates to the art of pulsating detectors of the type used to control the path of a moving web and more particularly to an improved driving circuit for pulsating radiation detectors.

INCORPORATION BY REFERENCE

The prior Pat. No. Ko 3,739,177 relates to the type of pulsing circuit contemplated by the present invention. Kall Pat. No. 4,157,477 relates to a receiver structure of the type used in a plusating detector system. The high frequency fluorescent light source H3110 manufactured by North Americal Manufacturing of Cleveland, Oh. is the type of fluorescent driving circuit to which the present invention is directed. The discriminating detector No. H3109 manufactured by North American Manufacturing Company of Cleveland, Oh. is the type of detector contemplated for use with the present invention. These patents and the data sheets regarding the fluorescent light source and deflectors (Bulletin Nos. 101.06 and 101.03) are incorporated by reference herein as general background information of the type of system to which the present invention is particularly directed.

BACKGROUND OF INVENTION

The present invention is particularly applicable for use in a system to detect the edge of a moving strip, such as a metal strip, as it is being processed and it will be described with particular reference therein; however, the invention has broader applications and may be used in other detectors of the type using a pulsating radiation emitting device, such as a fluorescent tube.

In various manufacturing processes, a long length of strip material, such as metal, fabric, paper, etc. are conveyed from location-to-location along conveying devices. It is generally necessary to correct any variation of the path along which the strip is moving. As the speed of the processing increases, more minute changes in the path cause substantial alignment difficulties. In addition, a rapid corrective measure predicated upon slight variations in the path must be made to assure efficient high speed operation involving the conveying of strip material. To maintain the correct path, several types of systems have been employed to detect the position of the edge of the moving strip. In some systems, both edges of the strip are detected to create a centering system as disclosed in U.S. Pat. No. 4,147,477. One of the more successful systems, whether of the centering type or of the single edge type, is a system employing pulsating radiation having a pulsating frequency which can be recognized by a detector. Such a system is illustrated in U.S. Pat. No. 3,739,177. In this type of system, the frequency of the pulses can be relatively high, in practice, approximately 5.0 K Hertz. In this manner, radiation, such as light, from a radiation emitting device, such as a fluorescent tube, can be pulsated at the known frequency so that the actual light being used for edge or center detection is received by the detector for purposes of correcting any variation in the desired path of the strip being conveyed. These systems are highly successful. The high pulsing frequency precludes interference from low frequency sources, such as ambient light which can include light reflected from rotating components of adjacent machinery and equipment.

Irrespective of the advantages realized by pulsating radiant detectors, these detectors heretofore have had a relatively low ratio of peak light to ambient light, i.e. signal-to-noise ratio. Thus, a brighter and more powerful light was required. In addition, the distance between the emitter and the detector had to be relatively close due to the low signal-to-noise ratio. Also, it was not possible to optimize efficiency of the radiating device since the pulsating light had to be adequate for discrimination. For that reason, the actual efficiency of the pulsating detector system was not high and the heating effect and the lifetime of the radiant tubes was relatively short. Also, the heating due to the necessity for increasing the power to obtain the desired results could cause some difficulty with other components associated with the pulsating detector systems. Since these prior systems used a transformer having a secondary in series with the emitting device, such as a fluorescent tube, there was a substantial tendency to create spikes and interference in the primary circuit due to the negative resistance characteristic of the tube as it fired to initiate each pulse. For that reason, the rate of pulsing of the tube through the transformer had to be maintained at lower levels. This tendency to create feedback interference and spikes in the primary circuit of the transformer was increased due to the fact that the circuit including the fluorescent tube required a current limiter, such as a capacitor or choke. These components have a tendency to store substantial energy which can cause interference and damage to the driving circuit for the transformer as the frequency of operation increases. These prior systems also had little capability of controlling the intensity of the light created by pulsing the radiation emitter or fluorescent tube. Still further, as the prior driving circuit for the transformer fluctuated due to differences in the incoming voltage, there was a corresponding change in the operating characteristics of the secondary circuit of the transformer as it fired the fluorescent tube in both the positive and negative directions. These disadvantages of the prior pulsating system do not affect their advantage over edge detecting or centering systems used prior to these pulsating devices; however, they are disadvantages to which the present invention is directed to make the pulsating radiation edge detector systems highly efficient and more responsive than now possible.

THE INVENTION

The present invention relates to an improvement in a pulsating radiation detector system of the type described above, which improvement overcomes the disadvantages of prior pulsating systems and which improvement allows higher frequency, higher signal-to-noise ratio, higher efficiency, longer life, and lower manufacturing costs.

In accordance with the present invention, there is provided an improvement in a pulsating radiation detector system of the type comprising means in a series circuit for emitting radiation in pulses in a selected, adjusted frequency, means responsive to the pulses of radiation at this frequency for creating a control signal related to the received radiation and a driving circuit for pulsating the radiation emitting means in the series circuit. The improvement involves modifying the driving circuit so that the pulses have a time base width less than the reciprocal of the frequency (in seconds), means for sensing current flow in the series circuit, means for limiting current in the series circuit and means for adjusting the pulse width as an inverse function of the sensed current. In this manner, the pulses have a width which is adjusted in accordance with the current flowing through the series circuit, i.e. through the fluorescent tube, at any given time. As the current increases, the pulse width decreases. Thus, there is a relatively constant power applied to the fluorescent tube or other radiation emitting device during the pulsing operation. In this manner, relatively narrow pulses can be created to produce a relatively high signal-to-noise ratio in the light transmitted from the emitting device to the detector device. The term "selected, adjusted frequency" indicates that the frequency is not a sine wave. In practice, the selected, adjusted frequency is 5 K Hertz so that this new improved driving circuit can be employed in a system wherein a detector is now designed to recognize 5 K Hertz light pulses.

In accordance with another aspect of the present invention, the pulse creating means in the improved driving circuit includes a transformer with a primary winding and a closely coupled secondary winding in series with the fluorescent tube and means for applying pulses of voltage across the primary winding. As a further improvement, there is an auxiliary winding in the series circuit which is loosely coupled to both the primary winding and the secondary winding of the transformer. In this manner, the current limiting source in the series circuit is not a capacitor or a pure choke. This auxiliary winding acts as a part of the transformer as the voltage in the primary increases. When the current of the secondary increases, the auxiliary winding acts as a choke. To accomplish this function, the auxiliary winding is loosely coupled to the primary and secondary winding. This is accomplished by providing a portion of the transformer core having an air gap or an area of low permeability. The loosely coupled winding is located at the low permeability section of the core so that it can act as a secondary during voltage increases in the primary. When the secondary current increases and voltage collapses the auxiliary winding is a choke to limit current.

In accordance with another aspect of the present invention, the driving circuit is ultimately actuated and then deactuated at a rate substantially less than the frequency of the pulsing system. In this manner, the pulse train acts as a carrier and the alternate operation of the driving circuit forms an envelope around the carrier. At the receiving portion of the system, i.e. at the detector, a high pass filter is employed as a first stage. This filter precludes stray energy from being directed into the actual detector. The output of this first stage filter is a series of envelopes formed from the passed pulses. By smoothing this signal, the incoming signal is formed into a pulsating signal at a substantially lower frequency. This lower frequency is then recognized by the next filter section for actual detecting of the amount of radiant energy transmitted from the radiation emitting device of the control system. In practice, the frequency of the driving circuit will be approximately 20 K Hertz. The driving circuit will be alternately actuated and deactuated at a frequency of approximately 5 K Hertz. Thus, the first stage filter will allow passage of the frequency of the driving circuit, i.e. 20 K Hertz. Thereafter, the signal is smoothed to produce 5 K Hertz signal which is then transmitted to the circuitry of the actual detector. The amount of energy detected is then used to control the mechanism for adjusting the position of the moving strip or other device the position of which is being detected by the system employing the present invention.

The primary object of the present invention is the provision of a pulsating radiation detector system, which system has a high peak-to-valley or signal-to-noise ratio, has a high efficiency, has a longer life, is operable over a large range of distance, and is less costly to manufacture.

A further object of the present invention is the provision of a pulsating radiation detector system, which system can operate at various frequencies substantially above 5 K Hertz without causing substantial disturbances in the driving circuit.

Still a further object of the present invention is the provision of a pulsating radiation detector system, as defined above, which detector system can be operated over a wide variety of supply voltage levels without substantial fluctuations in the total power employed by the radiation emitter of the system. In this manner, transmitting power remains substantially constant over variations in the supply voltage so that the operation of the pulsating radiation detector system is more uniform.

Another object of the present invention is the provision of a feedback circuit in a pulsating radiation detector system, which feedback circuit senses the amount of current flowing through the emitting device, such as a fluorescent tube, and controls the duty cycle or power of the tube as an inverse function of the sensed current. In this manner, the power can remain constant. In addition, relatively narrow pulses of radiation can be created at the fluorescent tube to create a substantially greater signal-to-noise ratio in the system.

Yet a further object of the present invention is the provision of an improved pulsating radiation detector system, which system includes a unique transformer arrangement in the driving circuit so that current flow through the tube can be limited by a winding which acts as a secondary during voltage increases and as a choke during voltage decreases.

Another object of the present invention is the provision of a driving circuit for a pulsating radiation detector, as defined above, which driving circuit does not produce oscillations and spikes in the primary circuit as the voltage collapses in the secondary circuit.

Still a further object of the present invention is the provision of a pulsating radiation detector system, as defined above, which system has a relatively high level of usable light for a given average light from the fluorescent tube or other radiation emitting device.

Another object of the present invention is the provision of a driving circuit for a pulsating radiation detector system, which driving circuit has a variable duty cycle wherein the pulses can be adjusted in width during operation of the system. In accordance with this object, the sensed current through the fluorescent tube can be used to adjust the duty cycle for the purpose of maintaining a preselected power for use at the fluorescent tube.

These and other objects and advantages will become apparent from the following description taken together with the drawings accompanying this disclosure.

PREFERRED EMBODIMENT

Figure 1:
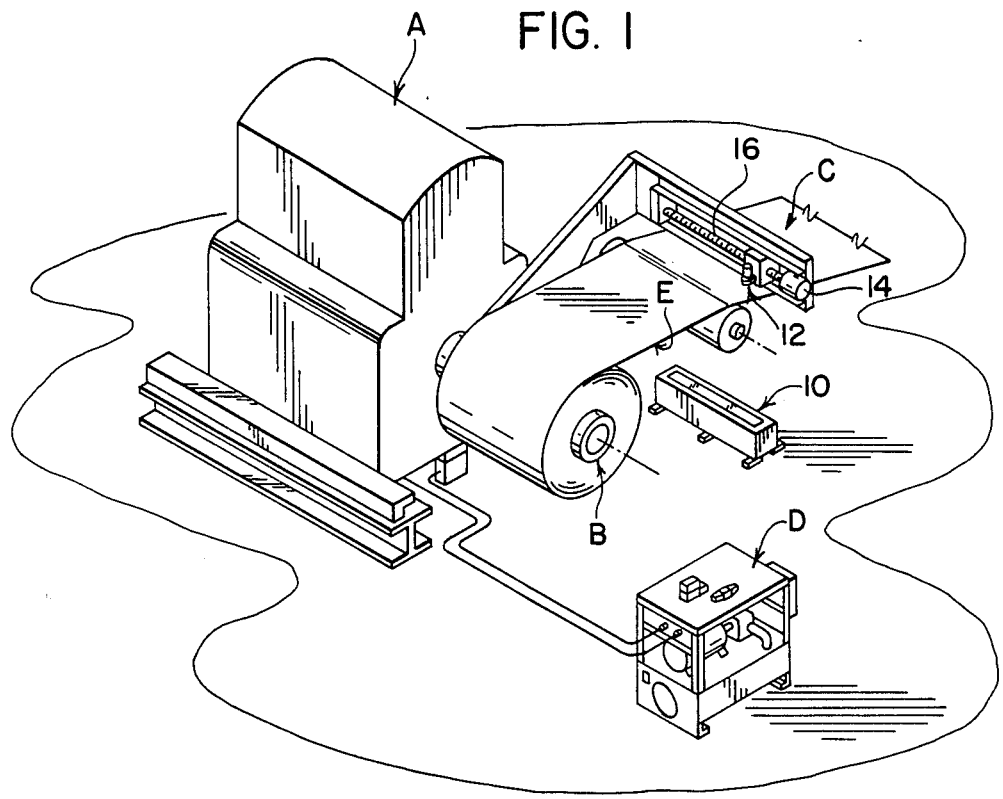
FIG. 1 is a pictorial view showing an installation employing the preferred embodiment of the present invention.
Figure 2:
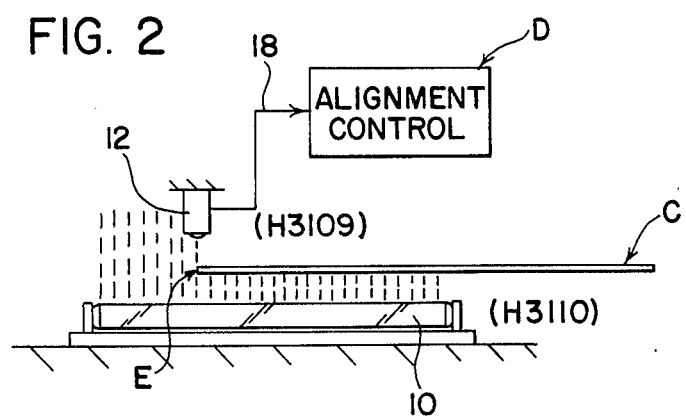
FIG. 2 is a schematic drawing illustrating a pulsating detector system of the type to which the present invention is directed.

Referring now to the drawings which are used for the purpose of illustrating the preferred embodiment of the invention only and not for the purpose of limiting same, FIGS. 1 and 2 illustrate a rewinder A having a rotatable arbor B for the purpose of rewinding a metal strip C onto the arbor. An adjusting mechanism D adjusts the position of rewinder A to assure that the arbor winds strip C in the desired shape. This type of mechanism is only one of many which employ a pulsating radiation emitting device for the purpose of controlling the path of a moving strip, such as metal strip C. These mechanisms employ a pulsating radiation emitter, such as fluorescent tube 10, and a detector, such as generally a cylindrical detector 12 positioned opposite fluorescent tube 10 and adjustably positioned with respect to edge E of moving strip C. The location of detector 12 is adjusted by an appropriate device, illustrated as motor 14 for rotating screw 16 to align detector 12 with edge E. A signal from detector 12 is created in line 18 and is directed to adjusting mechanism D so that the mechanism will take corrective action to assure proper position of edge E with respect to the adjusted position of detector 12. This description is generally background information showing the environment to which the present invention is particularly applicable.

Figure 3:
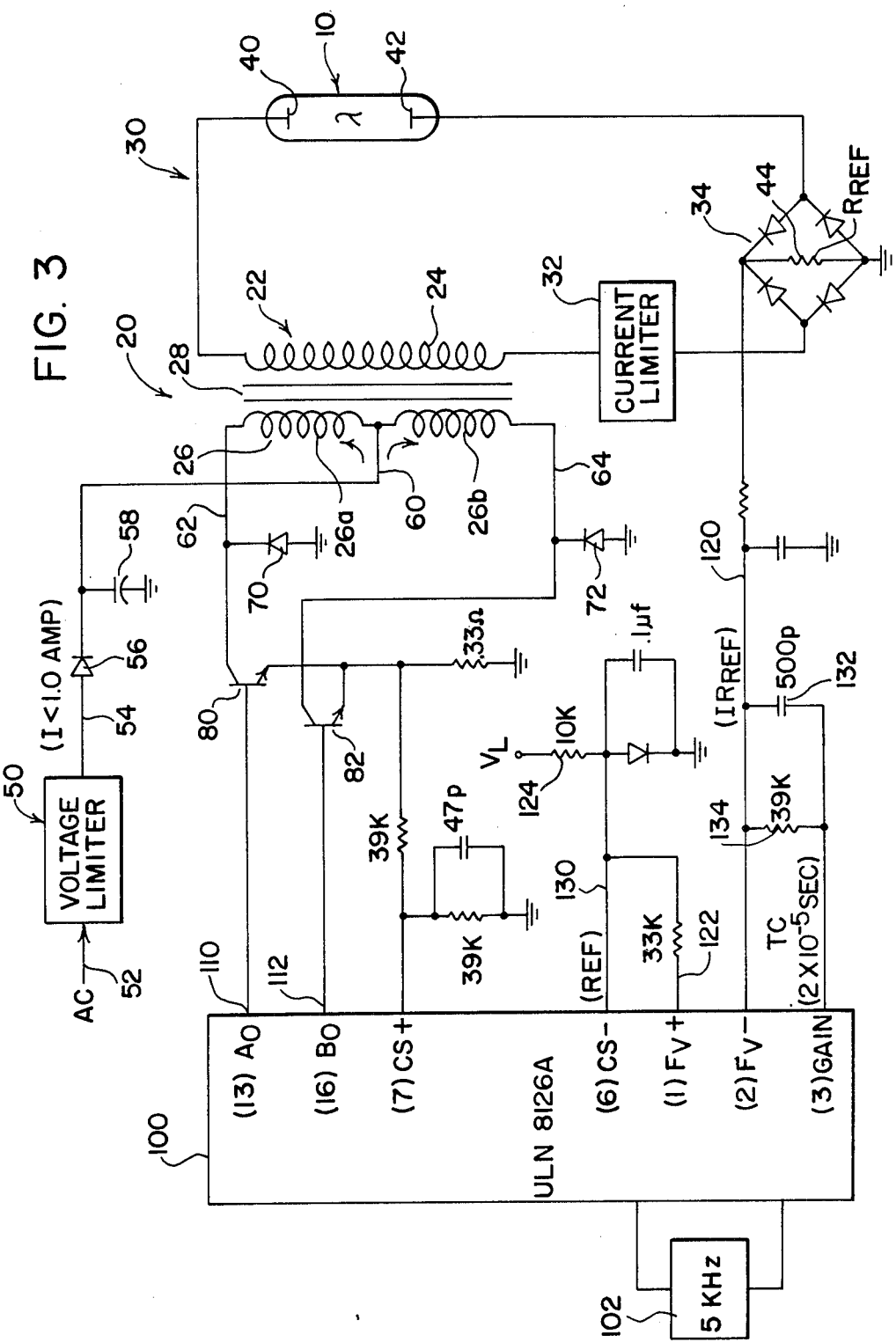
FIG. 3 is a simplified wiring diagram illustrating the feedback control of the duty cycle in accordance with one aspect of the present invention.
Figure 5:
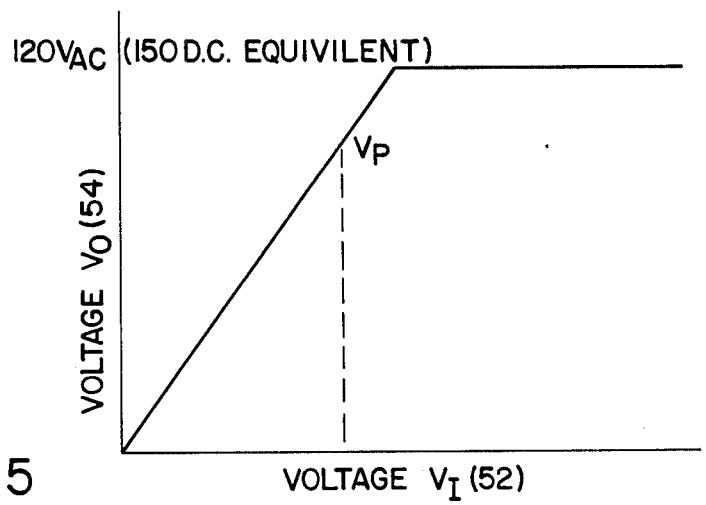
FIG. 5 is a graph illustrating the operating characteristics of the voltage input circuit employed in accordance with the preferred embodiment of the present invention.
Figure 6:
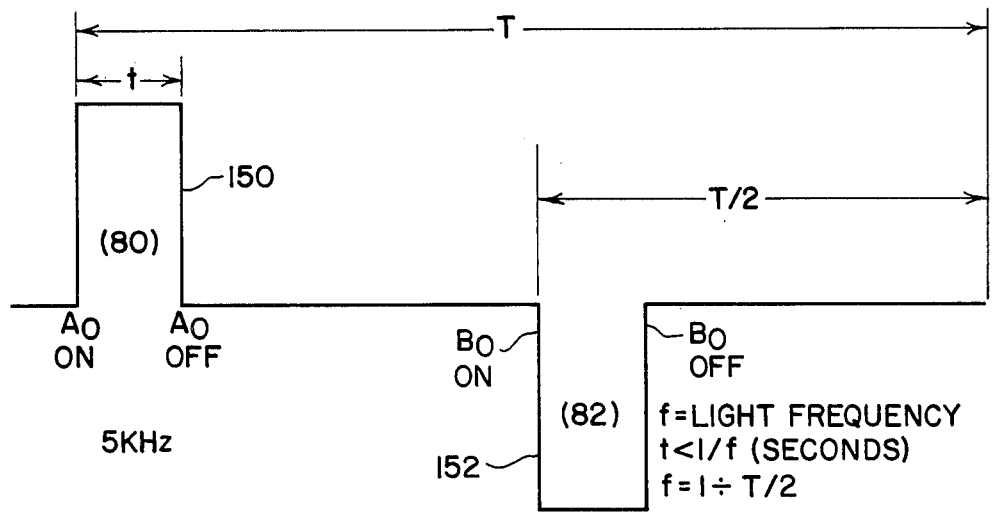
FIG. 6 is a pulse chart indicating the voltage applied to the primary of the transformer in a system constructed in accordance with the preferred embodiment of the present invention as illustrated in FIG. 3.
Figure 9:
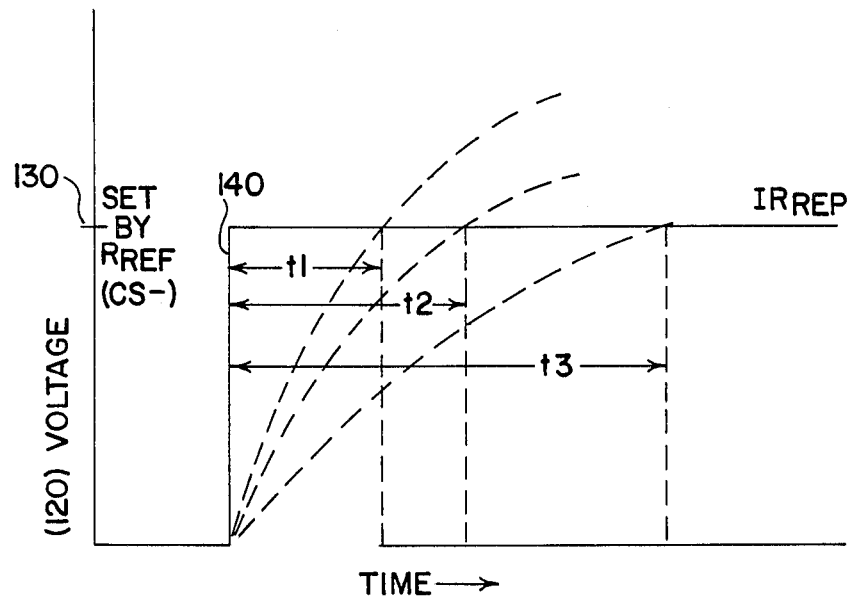
FIG. 9 is a graph illustrating the duty cycle adjustment in accordance with the sensed fluorescent tube current in the preferred embodiment of the present invention.
Figure 15:
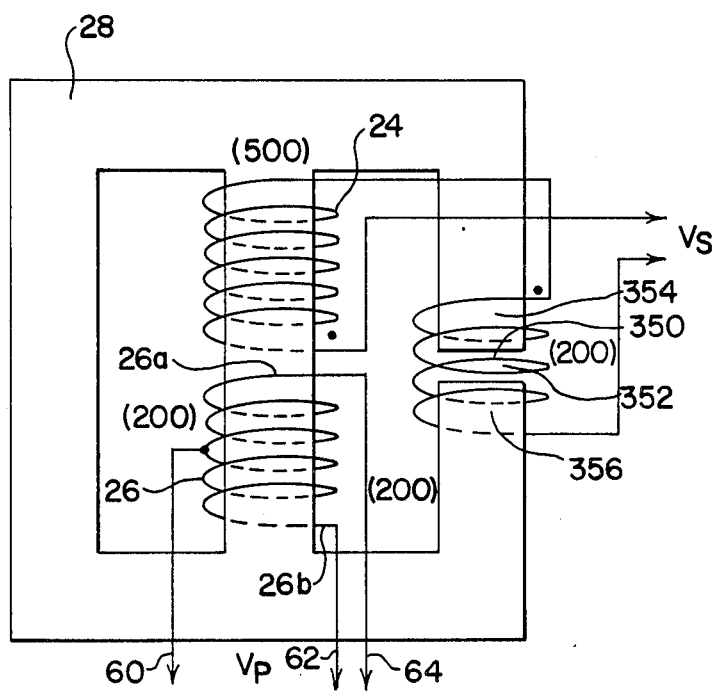
FIG. 15 is a schematic illustration of the transformer employed in the preferred embodiment of the present invention and illustrating, somewhat schematically, one aspect of the present invention as shown in FIGS. 10 and 16.
Figure 18:
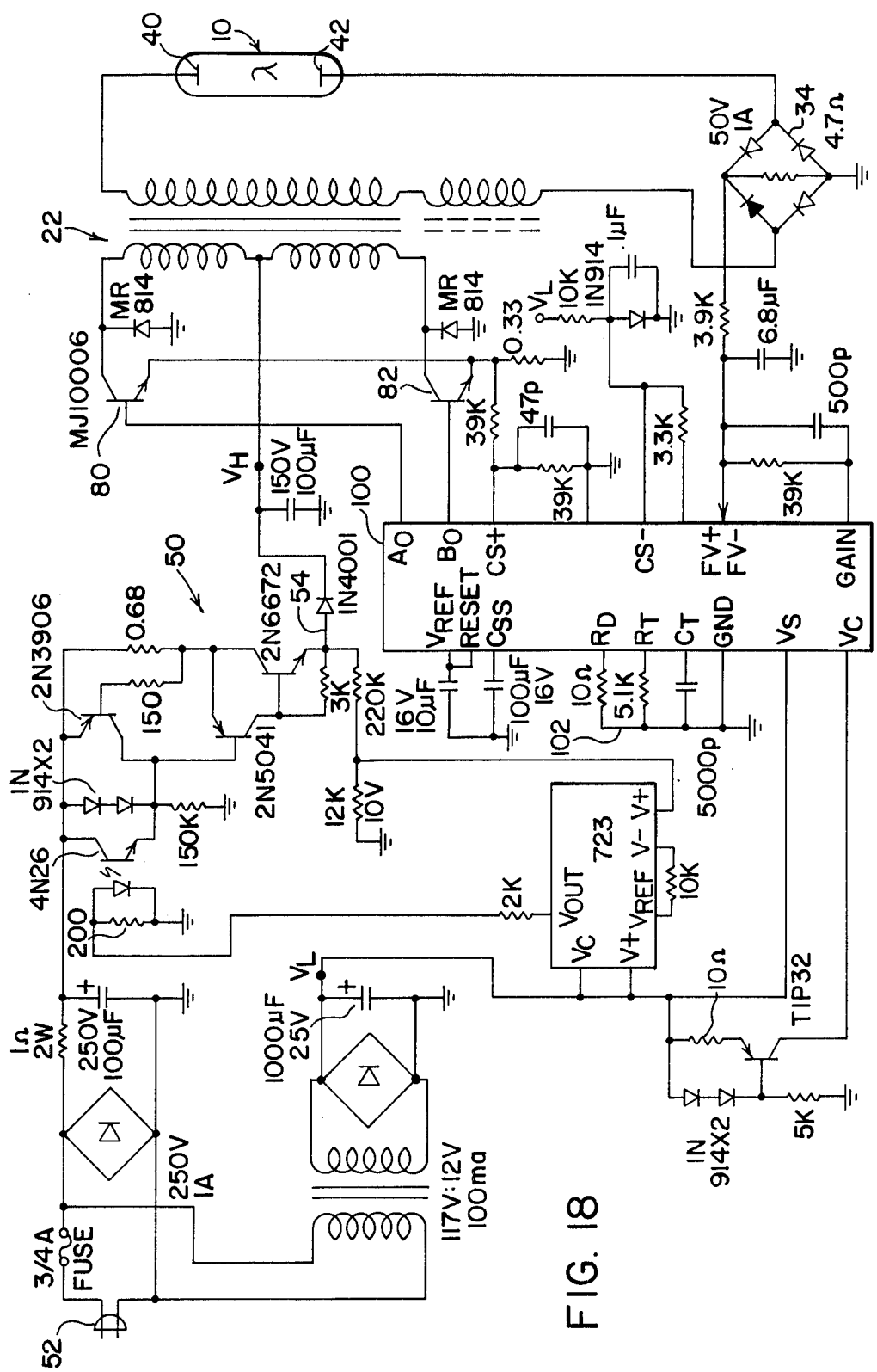

Referring now to FIG. 3, the preferred embodiment of the invention is illustrated wherein driving circuit 20 includes a transformer 22 with a secondary 24 and a primary 26. The primary is divided into segments 26a, 26b for the purpose of providing primary voltage in opposite directions. A high permeability core 28 constructed of a ferrite material, with the shape as shown in FIG. 15, is employed for tightly coupling the primary and secondary windings of the transformer. This coupling has a coupling factor approximately 1.0 so that the windings 24, 26 coact as transformer coupled windings. Secondary winding 24 is in a series circuit 30 containing current limiter 32 and a current sensor 34. Tube 10 is in the series circuit and is connected therein across tube terminals 40, 42. Resistor 44 is in the branch of a bridge forming the current sensor 34. The voltage across this resistor is indicative of the current flowing through circuit 30 and, thus, through tube 10. A voltage limiter and supply 50 provides the D.C. voltage input to transformer 22. The details of this voltage limiter and supply 50 is illustrated in the wiring diagram of FIG. 18. Essentially, input 50 has the characteristics illustrated in FIG. 5 wherein A.C. input 52 is converted to a D.C. output 54. Diode 56 is connected across capacitor 58 to provide a D.C. voltage at center tab 60 of transformer 22. As illustrated in FIG. 5, as the voltage increases at input 52, corresponding increase occurs at D.C. output 54 until approximately 120 volts A.C. have been directed to input 52. At that time, a limitter circuit chops the output so that the voltage applied to center tap 60 does not exceed 150 volts D.C. which corresponds to approximately 120 volts A.C. input. In practice, there is approximately a 2.0–4.0 voltage drop between the input and output of voltage supply 50. Until the saturated or maximum output voltage has been reached, there is generally a straight line relationship between the input and output. Because of variations in the normal input voltage to any control circuit of the type used in the present invention, driving circuit 20 employs current sensing circuit 34 to produce a relatively constant power output irrespective of the variations in the input voltage and center tap 60. End taps 62, 64 connect primary winding 26 across limiting diodes 70, 72 with the driving transistors 80, 82 at the primary outputs 110, 112 of IC circuit 100 in the form of a ULN 8126A manufactured by Sprague Electric Company of Worcester, Mass. This IC chip has several terminals some of which are set forth in parenthesis in FIG. 3. To alternately drive the primary outputs 110, 112, at a preselected duty cycle, there is provided an oscillating stage 102 which causes the outputs 110, 112 to be activated at a preselected adjusted rate determined by the oscillating stage 102 connected to the IC 100. An output signal from terminals 110, 112 forward bias driving transistors 80, 82 to alternately cause current flow through primary winding segments 26a, 26b. The width of the pulses, or the time that the terminals 110, 112 are actuated, is controlled by a duty cycle control signal on line 120. This signal is the voltage across resistor 44 of current sensing device 34. Thus, the voltage in line 120, which controls the duty cycle for the output terminals 110, 112, is the product of current $I_S$ through tube 10 and the resistance value of the reference resistor 44, i.e. $R_{REF}$. In practice this value is 4.7 Ohms. The voltage in line 120 is compared with the voltage at line 122 across resistor 124 connected to the input voltage $V_L$ the source of which is illustrated in FIG. 18. The reference voltage at line 122 is essentially controlled by the voltage in line 130 which is connected to terminal No. 6 of IC 100. The time constant for controlling the operation of the comparison between the voltage in line 120 and the voltage in line 122 is controlled by capacitor 132 and resistor 134. IC circuit 100, as connected in FIGS. 3 and 18, provides a duty cycle adjustment as illustrated in FIG. 9. The set reference in line 130 controls the width t of the output pulses appearing on lines 110, 112. As the current increases across the tube, voltage in input 120 increases. As the current in circuit 30 increases, the voltage in line 120 increases more rapidly. This produces a shorter pulse width t at the output of terminals 110, 112. A decrease in the current of series circuit 30 causes the width of the pulses at the outputs 110, 112 to increase. Thus, the sensed current across resistor 44 has an inverse effect on the duty cycle at output terminals 110, 112 of IC 100. Of course, other circuits could be employed for causing duty cycle of transistors 80, 82 to change inversely as the sensed current in the series circuit including tube 10. The power converted to light pulses at tube 10 remains substantially constant irrespective of supply voltage variations due to the novel current feedback circuit employed in accordance with one aspect of the present invention. Current across resistor 44 changes the operation of IC 110 in accordance with the time constant involved in the circuit as associated with input line 120. In this manner, the general level of duty cycle is varied in accordance with the accumulated sensed current being employed during pulsing of tube 10. Since pulsing occurs at a frequency of at least 5 K Hertz, there is essentially continuous adjustment of the duty cycle in accordance with the existing current flow within the secondary series circuit so that there is a continuous updating and control of the power used in creating light pulses by tube 10. Input variations under normal operating range indicated by the slope line in FIG. 5 do not result in corresponding changes in the output light of tube 10. The time width of the individual pulses is illustrated as $t_1$, $t_2$ and $t_3$ in FIG. 9. In practice, the maximum pulse width obtainable by the present invention is substantially less than the single pulse created by the oscillator of stage 102 of IC chip 100. The minimum pulse width as illustrated as line 140 in FIG. 9 may be adjusted to the value desired for the particular frequency being employed in driving circuit 20. Referring now to FIG. 6, the pulses 150, 152 are the pulses defining the conductive time of transistors 80, 82, respectively. The period T is the time involved in producing two pulses, one in each of the primary winding segments 26a, 26b. The distance t is the time during which transistors 80, 82 are conductive during one cycle of circuit 20. The relationship between t and T is the duty cycle which indicates the total time that there is power being applied by transformer 22 and to secondary series circuit 30. During each period T there are two pulses of light. Thus, the frequency f of light being emitted by tube 10 is the reciprocal of T/2. As can be seen, the pulse width t has to be less than the reciprocal of the light frequency expressed in seconds. The period T is fixed as the pulse width t is varied according to the sensed current flowing through resistor 44. In this manner, power is controlled by the sensed current as previously described.

Figure 7:
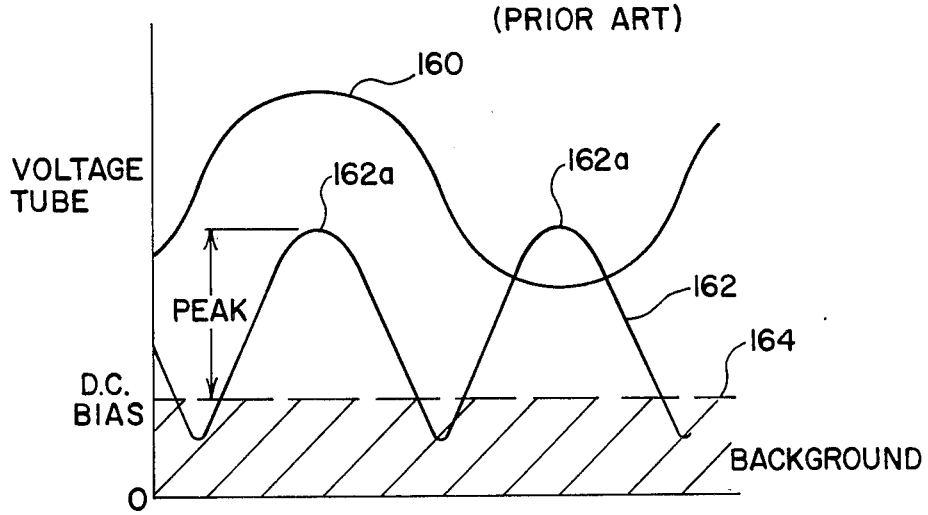
FIG. 7 is a graph illustrating the signal-to-noise ratio of the prior art to which the present invention is directed.
Figure 8:
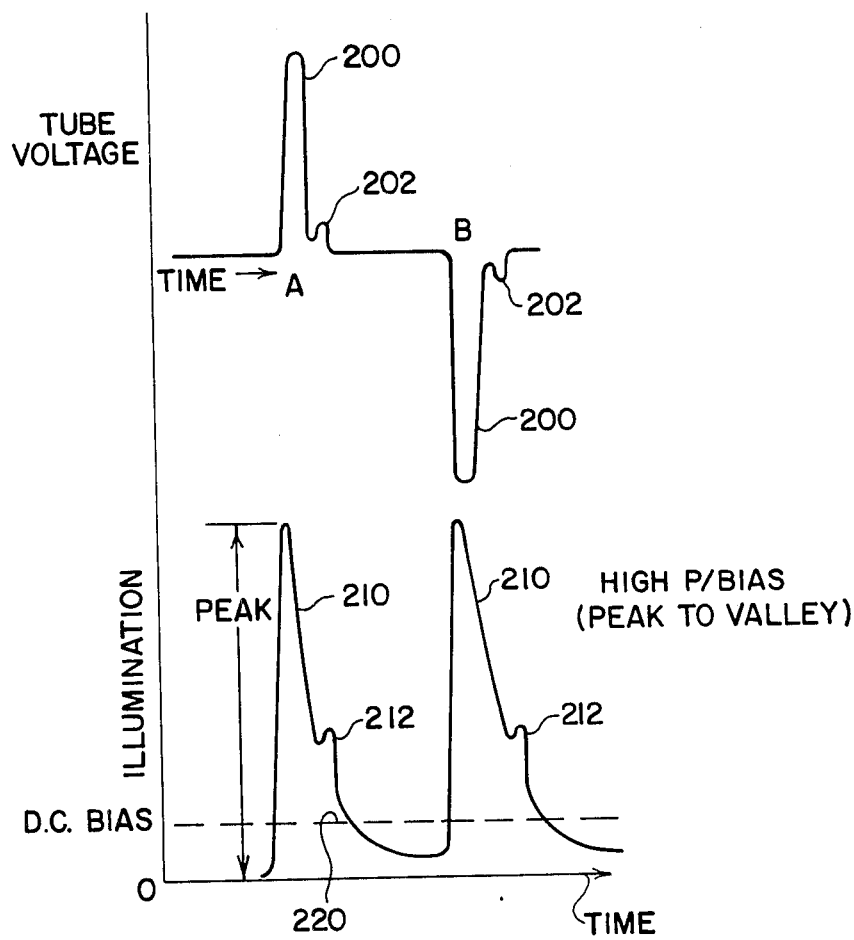
FIG. 8 is a graph illustrating the signal-to-noise ratio of a system employing the preferred embodiment of the present invention.

Referring now to FIGS. 7 and 8, one advantage of utilizing the present invention is illustrated. In FIG. 7, the voltage applied across tube 10 in the prior art system is illustrated as a general sinusoidal curve 160. This produces a conduction characteristic of the tube somewhat as illustrated as curve 162. As can be seen, even during a 5 K Hertz operation, light is ON for a prolonged period of time during each half cycle, i.e. during each pulse. Thus, an accumulated light intensity which is considered a D.C. level or bias of light from tube 10 is relatively high and represented by the level 164. Peaks 162a are not substantially higher in magnitude than the D.C. or background light. Thus, it is necessary to employ a high voltage current flow in the prior art pulsating devices so that the peaks 162a can be distinguishable from the background light level 164. Only the peaks are recognized by the detector. The representation in FIG. 7 indicates the need for higher intensity and the lack of definition resulting from using pulsing systems heretofore employed for pulsating radiation detectors to which the present invention is directed. The operation of the present invention as so far explained is represented in the charts of FIG. 8. The upper graph is the voltage across tube 10 which will be explained in more detail with respect to the wave forms shown in FIG. 11. Voltage pulses 200 are applied across tube 10 during each pulse of primary winding 26. The voltage is in opposite directions as indicated in the two pulses (A), (B) in the upper portion of FIG. 8. The pulses have relatively high magnitude compared to the time width. This is a distinct difference over the generally sinusoidal curve 160 of the prior art devices illustrated in FIG. 7. The slight hump 202 of pulses 200 is caused by reverse induced voltage when the primary voltage is removed by turning OFF either transistor 80 or 82. The lower curve of FIG. 8 illustrates the light intensity from tube 10. Light peaks 210 have a hump 212 corresponding generally to the induced voltage 202. As can be seen, the integrated volume under light pulses 210 are substantially less than the integrated value under pulses shown as curve 162 in FIG. 7. Thus, the D.C. voltage level or residual light illustrated as level 220 in FIG. 8 is substantially less than would be created when a continuous voltage is applied in opposite directions across primary winding 26, as done in the prior art. The use of short pulses and controlled duty cycle as contemplated by the present invention produces the relatively abrupt change in current across tube 10 which also causes immediate light pulses. The light pulses 210 are spaced according to the tuned frequency of detector 12, as previously described.

Figure 4:
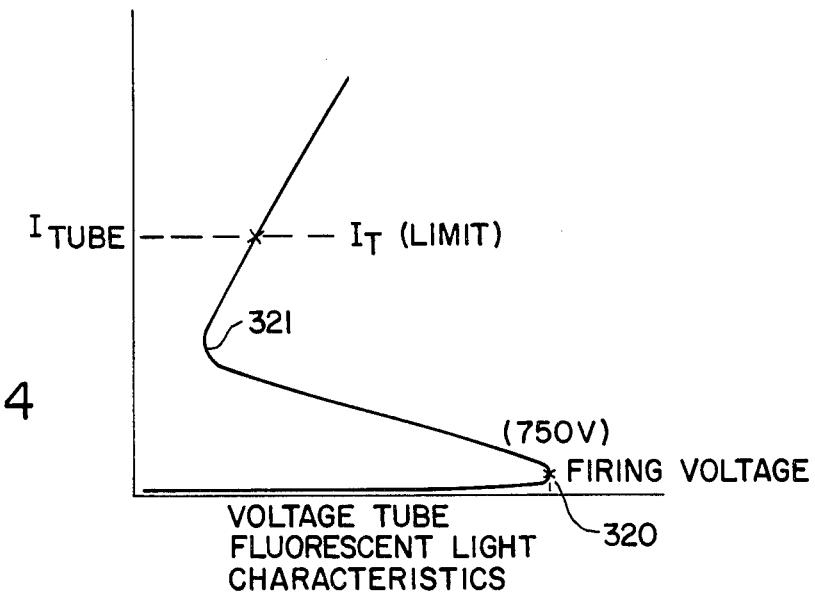
FIG. 4 is a graph illustrating an operating characteristic of a fluorescent tube and other arc discharge devices.
Figure 11:
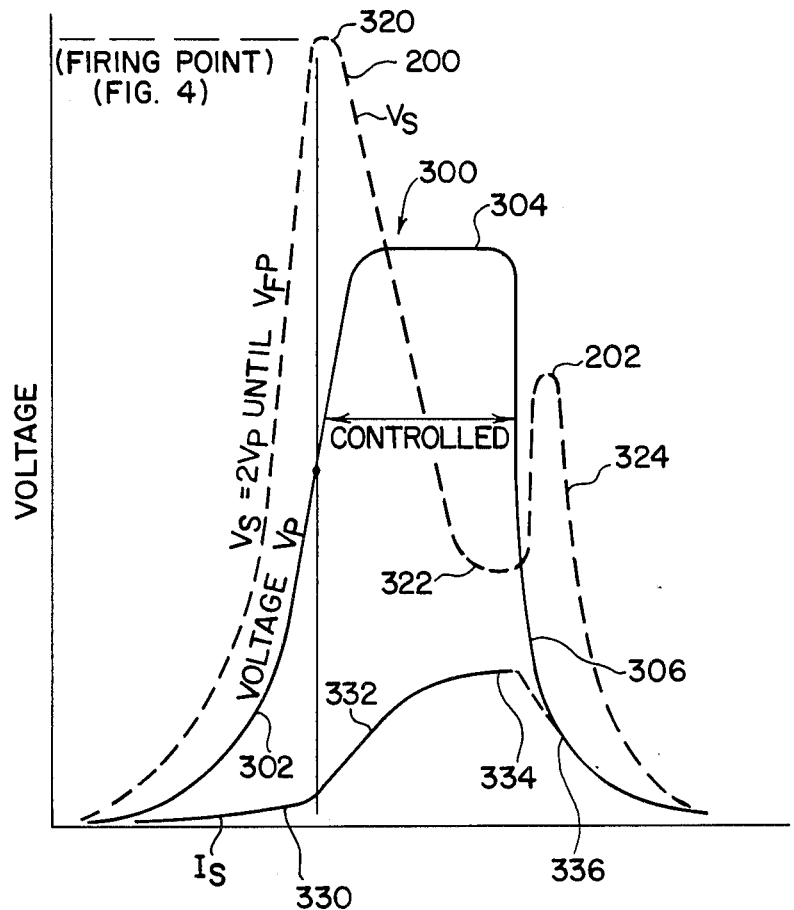
FIG. 11 is a graph illustrating certain voltage and current operating characteristics of a device employing the preferred embodiment of the present invention.

Referring now to FIG. 11 and to the tube characteristic curves of FIG. 4, the operation of series circuit 30 and tube 10 during each pulse from IC 100 is schematically illustrated. The primary voltage is shown as curve 300. This voltage increases during portion 302 and remains constant during full conduction of a driving transistor illustrated in portion 304 and collapses, as indicated in portion 306, when the driving transistor is turned OFF by IC circuit 100. The length of portion 304 is the duty cycle pulse width as previously described, In practice, there is approximately a 2:1 winding ratio between the operating segments of primary 26, either segment 26a, or segment 26b, and the tightly coupled secondary 24. Thus, the secondary voltage in curve 200 is approximately twice the primary voltage in addition to the voltage generated in auxiliary winding 350, i.e. portion 302. At firing point 320, tube 10 fires. This point is illustrated graphically in FIG. 4 and is a characteristic of fluorescent tubes. As the voltage across the tube increases, tube 10 can be represented as a very large resistance: therefore, no substantial current flows. At a voltage, in practice approximately 700–750 volts, the tube will fire, i.e. at firing point 320. At this time, there is a negative dynamic resistance across tube 10. The characteristic curve then drastically reduces the voltage across the tube at the same time the current $I_S$ rises beyond knee point 321, the current will rapidly increase. For that reason, it is common practice in driving circuits for pulsating fluorescent tubes to provide a current limiting device. This has been indicated to be current limiting device 32 in FIG. 3. After the firing point 320, the secondary voltage across tube 10 drops rapidly as illustrated in FIG. 11. As indicated by the knee 321 in FIG. 4, there is a voltage that is a characteristic of tube 10 that is stabilized across the tube as a light pulse is being created. This voltage is indicated as steady state portion 322 of curve 320. Thereafter, when the pulse is removed from the primary 24, the collapsing field around the primary causes the current in circuit 30 to decrease. This induces voltage across the tube in the same direction, as indicated by the hump 202 in FIG. 8. Thereafter, the voltage across the tube decreases awaiting a pulse in the opposite direction from one of the primary segments as created by driving transistors 80, 82, respectively. Tube current $I_S$ is represented in curve 330.

In FIG. 4 it is indicated that there is essentially no current flowing until the firing voltage reaches firing point 320. At that time, there is a tendency to have a substantial current flow through the tube. This cannot occur because of the current limiting device 32; therefore, the current increases along a sloped portion 332 in FIG. 11. At some time during a pulse of the primary winding 26, current in circuit 30 and through tube 10 stabilizes. This is indicated as generally flat portion 334 of curve 330. This is the current being sensed across resistor 44 and is used to control the duty cycle and thus the width of the primary pulse 300 shown in FIG. 11. The value of the generally flat portion 334 of current curve 330 is controlled by the voltage applied to the primary winding during a pulse in one of the primary segments. Thus, the sensed current as determined by the voltage across resistor 44 is correlated to the available voltage at the primary winding so that the total power transmitted to tube 10 during each pulse is controlled by the duty cycle at outputs 110, 112. When the pulse through the primary is removed, the current in circuit 30 decreases as indicated by declining portion 336 of curve 300. This collapse induces voltage across the light and allows the tube itself to dissipate energy during the hump portion 202. By using the present invention, the tube itself dissipates a substantial portion of the energy which allows it to be used as useful light and not transmitted back into the primary by transformer action.

Figure 10:
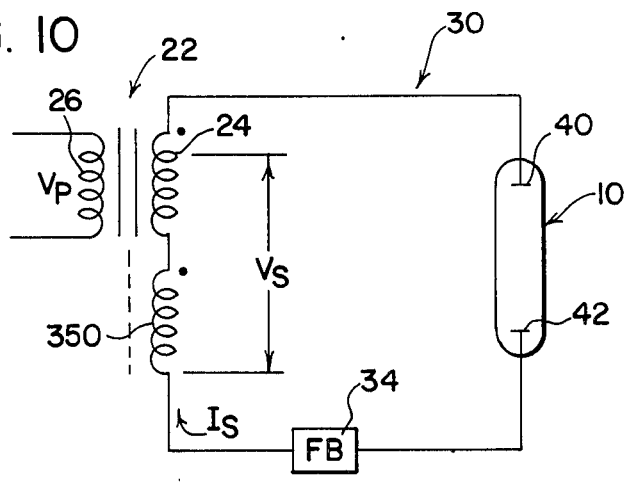
FIG. 10 is a simplified wiring diagram showing a novel transformer construction.
Figure 16:
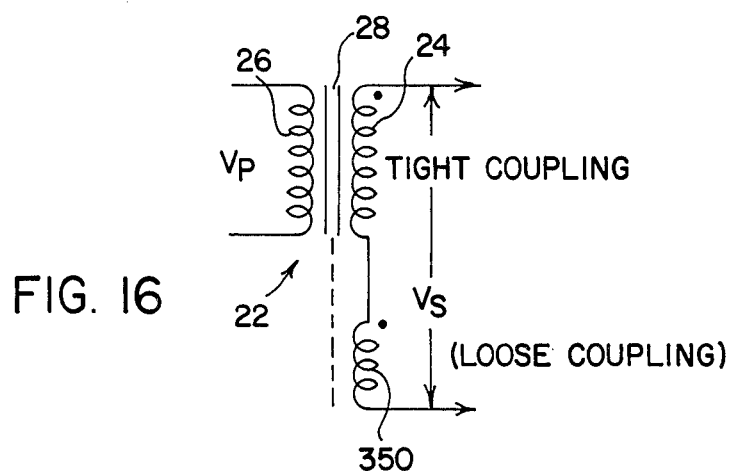
FIG. 16 is a wiring graph illustrating the aspect of the present invention related to the transformer illustrated in FIG. 15.

Referring now to FIGS. 10, 15 and 16, a further aspect of the present invention is illustrated. In accordance with this aspect of the invention, there is a novel current limiter which is in the form of an auxiliary winding 350 wound on the same core 28 as primary and secondary windings 26, 24. In practice, segments 26a, 26b are tightly coupled with secondary 24 by core 28. Segments 26a, 26b each include 200 turns. Secondary winding 24 includes 500 turns. There are 200 turns in auxiliary winding 350. Auxiliary winding 350 is loosely coupled with core 28 and, thus, with the other windings 24, 26. This can be accomplished by reducing the amount of core 28 within the winding. In practice, a segment 352 of core 28 is cut away. Portions 354, 356 of core 28 extend into opposite axial ends of winding 350 so that there is at least a transformer action between primary 26 and winding 350 during the application of voltage across one of the primary segments 26a, 26b. Operation of this unique current limiting concept is illustrated schematically in FIG. 16. During a pulse of voltage across primary 26, there is an induced voltage in both secondary winding 24 and auxiliary winding 350. Thus, both windings are used in creating the secondary voltage $V_S$ across tube 10. When the firing voltage occurs, there is a negative resistance characteristic across the tube as previously described with respect to the characteristic curve of FIG. 4. At this time, auxiliary winding 350 acts as a choke to prevent substantial increases in current. This controls the slope portion 332 of the secondary current curve 330 shown in FIG. 11. When voltage is removed from the primary winding, the voltage across winding 24 tends to collapse. Again, the auxiliary winding 350 acts as a choke to limit current change in secondary circuit 30. By providing a loose coupling of auxiliary winding 350, it performs as a secondary transformer winding during the initial portion of the individual pulses and as a choke when current tends to increase rapidly due to the particular characteristic of tube 10. This same negative resistance characteristic, as illustrated in FIG. 4, is found in arc welding, and other types of discharge devices. The transformer shown in FIG. 15 would be equally applicable in that type of circuit to control current flow after the firing point voltage has been reached.

Figure 17A:
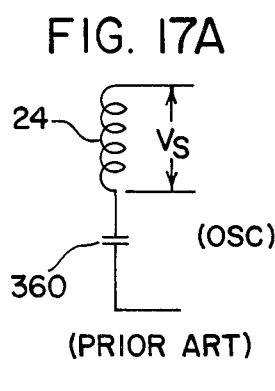
FIGS. 17A and 17B are prior art devices for limiting the current flow in the fluorescent tube of the series circuit being pulsed by the driving circuit; and, FIG. 18 is a detailed schematic wiring diagram with components labeled for the purpose of disclosing the present circuit utilized to practice the various aspects of the invention disclosed herein.
Figure 17B:
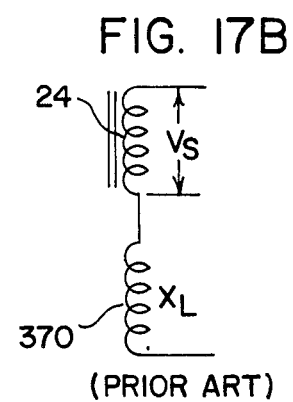

Prior art arrangements for controlling current in the second circuit are illustrated in FIGS. 17A, 17B. Capacitor 360 is placed in the series circuit and limits increased current flow when the firing point voltage has been reached in tube 10. This type of current limiting arrangement will cause stored energy and ringing to be introduced back into the primary circuit and power supply. This arrangement would present difficulties when a duty cycle control arrangement is employed for the purpose of creating very thin pulses of light from tube 10 as used in the present invention. By providing relatively narrow light pulses, the frequency can be drastically increased to allow for another advantage to be described in more detail with respect to the subject matter of FIGS. 12-14. Referring now to FIG. 17B, the prior art sometimes employed a choke 370 for the purposes of limiting tube current. This choke had a relatively low permeability and would cause energy dissipation in the choke itself. In accordance with the present invention, the energy dissipation is primarily in the tube. In the arrangement of FIG. 17B, the secondary voltage is induced only across secondary winding 24. Thus, choke 370 is accepting energy even during the initial portion of the primary pulse. This is not the operation of auxiliary winding 350 in the present invention wherein it actually is employed for the purposes of creating voltage during the initial portion of the pulse in the primary winding 26.

The general operation of the preferred embodiment of the invention, as so far described, is illustrated schematically in FIG. 10. The feedback device 34 measures the current $I_S$ and changes the duty cycle in accordance with the sensed current. The voltage $V_S$ in secondary series circuit 30 is created across both windings 24, 350. After the tube 10 has fired to create a light pulse, the auxiliary winding 350 operates as a choke for limiting current flow. This is illutrated as box 32 in FIG. 3.

Figure 12:
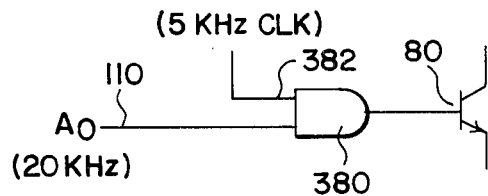
FIG. 12 is a block diagram illustrating a gating arrangement for creating a pulsing envelope for the emitted pulses from a device constructed in accordance with one aspect of the present invention.
Figure 13:
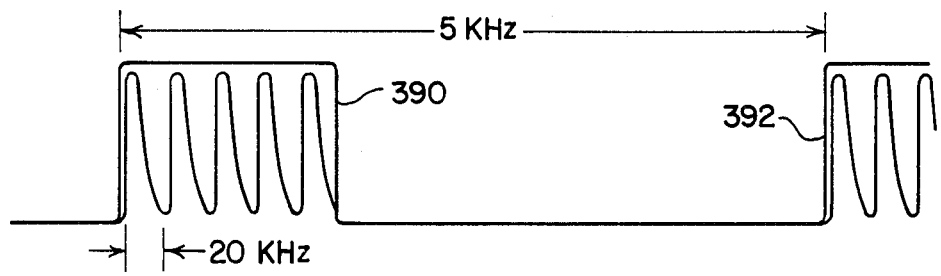
FIG. 13 is a pulse chart representing the output light emitted from a detector employing one aspect of the present invention.
Figure 14:
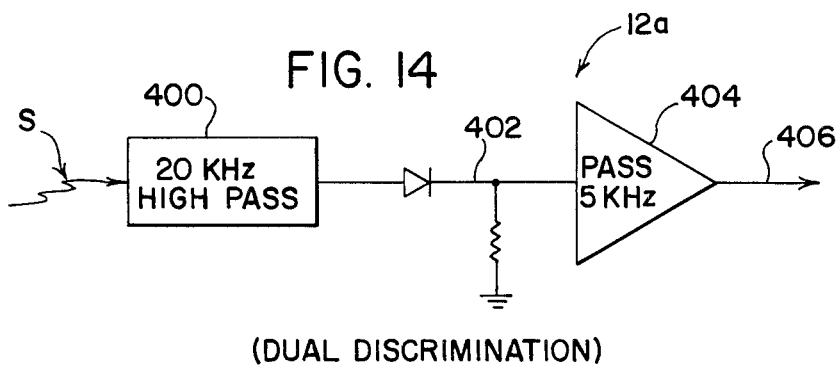
FIG. 14 is a schematic wiring diagram illustrating a detector discriminating circuit utilizing the aspect of the invention illustrated in FIGS. 12 and 13.

Another aspect of the present invention is illustrated in FIGS. 12-14 wherein the frequency of pulses at terminals 110, 112 is increased. In practice, the increase is to 20 K Hertz, as shown in FIG. 12. The A output pulses in line 110 are directed to the input of AND gate 380. The other input 382 is a clock pulse having a frequency of 2.5 K Hertz. Thus, driving transistor 80 is operated at a rate of 2.5 K Hertz. During each operation, transistor 80 is operated at a frequency of 20 K Hertz. The output in the primary winding controlled by driving transistor 80 is illustrated in FIG. 13. A 5 K Hertz signal involving envelope 390 from terminal 110 and an alternate pulse 392 from terminal 112 is created with a carrier having a frequency of 20 K Hertz. This signal is applied as a light signal S with a high pass filter stage 400 of the input portion 12a of detector 12. This filter allows only signal S to pass through so that the smoothing circuit 402 can remove the individual pulses in envelopes 390, 392 to apply a 5 K Hertz signal to the input side of a 5 K Hertz pass filter 404. The output of this filter is in line 406 and is directed to the circuitry previously employed for the purpose of measuring the amount of light transmitted from tube 10 for the purposes of controlling the position of a strip being monitored by modification of the preferred embodiment of the invention as illustrated in FIGS. 12-14. The detector discriminating circuit 12a shown in FIG. 14 is advantageous in that the 20 K Hertz carrier is completely distinct from any ambient light conditions in any normal environment. By employing a two stage discriminating circuit, as shown in FIG. 14, the circuitry already available for use at 5 K Hertz can be employed even though the frequency output of tube 10 is increased to a high level, such as 20 K Hertz.

Having thus described the invention, the following is claimed:

1. In a pulsing radiation detector system comprising means in a series circuit for emitting radiation in pulses of a selected, adjusted frequency (f), means responsive to pulses of radiation at said frequency for creating a control signal related to the received radiation, and a driving circuit for pulsing said radiation emitting means in said series circuit, said pulsing radiation detector further comprising: said driving circuit having means for creating voltage pulses in said series circuits, said pulses having a time base width (t) less than 1/f in seconds, means for sensing current flow in said series circuit, means for limiting the current in said series circuit and means for adjusting said pulse width (t) as an inverse function of said sensed current; said radiation emitting means is a fluorescent light tube and said radiation pulses are light pulses; said pulse creating means including a transformer with a primary winding and a closely coupled secondary winding in said series circuit and means for applying pulses of voltage across said primary winding; said primary winding divided into a first segment and a second segment and said pulse applying means includes means for applying voltage pulses alternately across said first and second segments; and wherein said current limiting means is a winding in said series circuit and loosely coupled with both said primary winding and said secondary winding.

2. In a pulsing radiation detector system comprising means in a series circuit for emitting radiation in pulses of a selected, adjusted frequency (f), means responsive to pulses of radiation at said frequency for creating a control signal related to the received radiation, and a driving circuit for pulsing said radiation emitting means in said series circuit, said pulsing radiation detector further comprising: said driving circuit having means for creating voltage pulses in said series circuit, said pulses having a time base width (t) less than 1/f in seconds, means for sensing current flow in said series circuit, means for limiting the current in said series circuit and means for adjusting said pulse width (t) as an inverse function of said sensed current; said radiation emitting means is a fluorescent light tube and said radiation pulses are light pulses; said pulse creating means including a transformer with a primary winding and closely coupled secondary winding in said series circuit and means for applying pulses of voltage across said primary winding; and wherein said current limiting means is a winding in said series circuit and loosely coupled with both said primary winding and said secondary winding.

3. In a pulsing radiation detector system comprising means in a series circuit for emitting radiation in pulses of a selected, adjusted frequency (f), means responsive to pulses of radiation at said frequency for creating a control signal related to the received radiation, and a driving circuit for pulsing said radiation emitting means in said series circuit, said pulsing radiation detector further comprising: said driving circuit having means for creating voltage pulses in said series circuits, said pulses having a time base width (t) less than 1/f in seconds, means for sensing current flow in said series circuit, means for limiting the current in said series circuit and means for adjusting said pulse width (t) as an inverse function of said sensed current; said pulse creating means including a transformer with a primary winding and a closely coupled secondary winding in said series circuit and means for applying pulses of voltage across said primary winding; and wherein said current limiting means is a winding in said series circuit and loosely coupled with both said primary winding and said secondary winding.

4. In a pulsing radiation detector system comprising means in a series circuit for emitting radiation in pulses of a selected, adjusted frequency (f), means responsive to pulses of radiation at said frequency for creating a control signal related to the received radiation, and a driving circuit for pulsing said radiation emitting means in said series circuit, said pulsing radiation detector further comprising: said driving circuit having means for creating voltage pulses in said series circuits, said pulses having a time base width (t) less than 1/f in seconds, means for sensing current flow in said series circuit, means for limiting the current in said series circuit and means for adjusting said pulse width (t) as an inverse function of said sensing current; said pulse creating means including a transformer with a primary winding and a closely coupled secondary winding in said series circuit and means for applying pulses of voltage across said primary winding; and wherein said pulse creating means further includes means for limiting the voltage of said pulses applied across said primary winding.

5. In a pulsing radiation detector system comprising means in a series circuit for emitting radiation in pulses of a selected, adjusted frequency (f), means responsive to pulses of radiation at said frequency for creating a control signal related to the received radiation, and a driving circuit for pulsing said radiation emitting means in said series circuit, the improvement comprising: said driving circuit having means for creating voltage pulses in said series circuits. said pulses having a time base width (t) less than 1/f in seconds, means for sensing current flow in said series circuit, means for limiting the current in said series circuit and means for adjusting said pulse width (t) as an inverse function of said sensed current; and wherein said driving circuit is alternately actuated to produce said pulse and then deactuated to create no pulse, means for causing said alternation at a given rate less than said frequency whereby said alternation creates a pulsating envelope for said pulses.

6. In a circuit for applying pulses of a selected, adjusted frequency across a voltage discharge device, said circuit including means for creating said voltage pulses at said frequency and means for limiting the current through said device after it discharges, the improvement comprising: means sensing current flow through said device and means for adjusting the time base width of said pulses as an inverse function of said sensed current; said pulse creating means including a transformer with a primary winding and a closely coupled secondary winding in a series circuit with said voltage discharge device and means for applying pulses across said primary winding; said primary winding divided into a first segment and a second segment and said pulse applying means including means applying voltage pulses alternately across said first and second segments; and wherein said current limiting means is a winding in said series circuit and loosely coupled with both said primary winding and said secondary winding.

7. In a circuit for applying pulses of a selected, adjusted frequency across a voltage discharge device, said circuit including means for creating said voltage pulses at said frequency and means for limiting the current through said device after it discharges, the improvement comprising: means sensing current flow through said device and means for adjusting the time base width of said pulses as an inverse function of said sensed current; said pulse creating means including a transformer with a primary winding and a closely coupled secondary winding in a series circuit with said voltage discharge device and means for applying pulses across said primary winding; and wherein said current limiting means is a winding in said series circuit and loosely coupled with both said primary winding and said secondary winding.

8. In a transformer for applying pulses of a selected, controlled frequency across a voltage discharge device in a series circuit and of the type with a characteristic curve which has a negative resistance after discharge of said device at a firing point, said transformer having a primary winding and at a firing point, said transformer having a primary winding and second winding closely coupled to said primary winding by a magnetic core, said secondary winding being in said series circuit, the improvement comprising: a current limiter in said series current comprised of an auxiliary winding in a series with said secondary winding and means for providing a loose coupling of said auxiliary winding with said primary and secondary windings 9. The improvement as defined in claim 8 wherein said loose coupling means includes means for winding said auxiliary winding about a selected portion of said core and means for reducing the coupling at said selected portion.

10. The improvement as defined in claim 9 wherein said coupling reducing means is a cut out section of said core at said selected portion whereby the effective permeability within said auxiliary winding is substantially decreased.

11. In a pulsating radiation detector system comprising means for emitting radiation in pulses of a selected, adjusted frequency, means responsive to pulses of radiation at said frequency for creating a control signal related to the received radiation and a driving circuit for pulsing said radiation emitting means, the improvement comprising: said driving circuit including means for successively driving said radiation emitting means at said frequency at selected intervals at a rate less than said frequency whereby said intervals create an envelope for said pulses of radiation and said responsive means includes a first filter means for passing said selected frequency, a smoothing circuit to produce said envelope as pulses and a second filter for passing said produced pulses.

* * * * *